United States Patent
Harvey et al.

[11] Patent Number: 5,126,661
[45] Date of Patent: Jun. 30, 1992

[54] OPTICAL PROBING METHOD AND APPARATUS

[75] Inventors: George T. Harvey, Princeton; Michael S. Heutmaker, Trenton, both of N.J.

[73] Assignee: AT&T Bell Laboratories, Murray Hill, N.J.

[21] Appl. No.: 599,579

[22] Filed: Oct. 18, 1990

[51] Int. Cl.$^5$ .............. G01R 23/00; G01R 23/16
[52] U.S. Cl. .................. 324/158 R; 324/72; 324/77 K; 324/96
[58] Field of Search ............ 324/72, 72.5, 96, 77 K, 324/77 R, 79 R, 79 D, 158 R; 350/374, 384; 250/492.2, 227.18, 227.21

[56] References Cited

U.S. PATENT DOCUMENTS

| | | | |
|---|---|---|---|
| 3,614,451 | 10/1971 | Gunn | 250/217 |
| 4,446,425 | 5/1984 | Valdmanis et al. | 324/77 |
| 4,553,099 | 11/1985 | Kasahara et al. | 324/72 |
| 4,618,819 | 10/1986 | Mourou et al. | 324/77 |
| 4,681,449 | 7/1987 | Bloom et al. | 356/364 |
| 4,737,719 | 4/1988 | Moore | 324/79 R |

FOREIGN PATENT DOCUMENTS 0171271 10/1982 Japan .................. 324/96

OTHER PUBLICATIONS

"100 GHz On-Wafer S-parameter Measurements by Electrooptic Sampling," by R. Majidi-Ahy et al., 1989 *IEEE MTT-S Digest*, pp. 299-301.

"Electro-optic Sampling Measurement of High-Speed InP Integrated Circuits," by J. M. Weisenfeld, et al., *Applied Physics Letters*, vol. 15, No. 19, May 11, 1987, pp. 1310-1312.

"Picosecond Optical Sampling of GaAs Integrated Circuits," by K. J. Weingarten et al., *IEEE Journal of Quantum Electronics*, vol. 24, No. 2, Feb. 1988, pp. 198-220.

*Primary Examiner*—Kenneth A. Wieder
*Assistant Examiner*—William J. Burns
*Attorney, Agent, or Firm*—Roderick B. Anderson

[57] ABSTRACT

An integrated circuit (11) is tested at a high microwave frequency through the use of a laser beam (19) having a repetition rate much lower than the test frequency. Electric fields of the test signal extend into an electro-optic material (12) that modulates part of the laser beam. Another part of the laser beam is converted to an electrical pulsed signal that is applied to a microwave mixer (33) along with part of the test frequency signal. A harmonic of the pulsed signal mixes with the test frequency to yield a difference frequency that can be used as a phase reference for analyzing the phase of the test signal. The component pulses (30) of the laser beam have a pulse width which is much shorter than the separation of the pulses, which make it inherently rich in higher harmonics of the fundamental pulse repetition rate.

14 Claims, 1 Drawing Sheet

OPTICAL PROBING METHOD AND APPARATUS

GOVERNMENT RIGHTS

The U.S. Government has rights in the disclosed invention pursuant to U.S.A.F. Contract No. F33615-89-C-5712.

TECHNICAL FIELD

This invention relates to electro-optic techniques for diagnosing electronic circuits.

BACKGROUND OF THE INVENTION

A common method for testing semiconductor integrated circuit chips is to contact a conductor on the chip with a conductive probe so that the voltage on the conductor can be measured. As microelectronic circuit densities increase, the deleterious effects of reactive loading on the circuit by the probe also increase; it also becomes more difficult to make reliable contacts. The U.S. patent of Bloom et al., No. 4,681,449, granted Jul. 21, 1987, and the paper, "100 GHz On-Wafer S-parameter Measurements by Electrooptic Sampling," by R. Majidi-Ahy et al., 1989 *IEEE MTT-S Digest*, pp. 299–301, are examples of the literature concerning electro-optic sampling which avoid the need for a conductive probe. This technique relies on the proximity of an electro-optic material to the conductor under test, and is particularly applicable to the testing of group III-V semiconductor chips such as gallium arsenide which are inherently electro-optic. The electric field around the conductor extends into the electro-optic material and modulates the polarization of a laser beam that is directed through the electro-optic material. By analyzing the polarization modulations of the exiting laser beam, one can characterize the voltage on the conductor, and thereby test or diagnose the operation of the semiconductor chip. If the semiconductor chip is not of electro-optic material, one can still use this method by placing an electro-optic probe tip sufficiently close to a conductor of the chip to permit modulation of laser light by electric fields extending through the electro-optic material.

The laser used is typically a pulsed laser producing a beam of light pulses having a repetition rate related to the frequency of the signal in the device under test. For example, in the Bloom et al. patent, the electrical signal exciting the device under test is taken from the laser beam used for probing. In the Majidi-Ahy paper, separate excitation sources are used for the laser and for the device under test, and a timing stabilizer is used to coordinate the pulse rate of the laser with the frequency of the signal in the device under test. The paper, "Electro-optic Sampling Measurements of High Speed InP Integrated Circuits," by J. M. Weisenfild, et al. *Applied Physics Letters*, Vol. 15, No. 19, May 11, 1987, pp. 1310–1312, describes a method that makes use of a mixer for mixing the test signal driving the device with the signal driving the laser so as to provide a difference frequency that can be used as a reference for analyzing the test data. This requires that the frequency of the laser pulses be faily close to the device excitation frequency, which often is not true, particularly if one desires to test extremely high frequency circuits. For example, a practical pulse rate for the laser may be one gigahertz, while the device may require testing at a frequency of ten gigahertz. Any scheme using separate sources for exciting the laser and the device under test runs the risk of phase drift during the testing, which may lead to inaccurate results. We have found that phase drifts as rapid as three degrees per minute are common even with the best equipment available on the market. Accordingly, there is a continuing need for non-invasive probing techniques that give accurate results, particularly in terms of phase, and which are consistent with high frequency testing, particularly at high microwave frequencies.

SUMMARY OF THE INVENTION

In accordance with one embodiment of the invention, an integrated circuit is tested at a high microwave frequency through the use of a laser light beam having a repetition rate much lower than the test frequency. As in the prior art systems, electric fields of the test signal extend into an electro-optic material that modulates the laser beam. However, part of the laser beam is converted to an electrical pulsed signal that is applied to a microwave mixer along with part of the test frequency signal. A harmonic of the pulsed signal mixes with the test frequency signal to yield a difference frequency that can be used as a phase reference for analyzing the phase of the test signal. That is, after the laser beam has been modulated in the electro-optic material, it is analyzed so as to characterize the test signal in the device under test, and the difference frequency is used as a phase reference in making this characterization.

The invention makes use of the fact that a pulsed laser beam having pulse widths that are short with respect to the separation of the pulses inherently is rich in higher harmonics of the fundamental repetition rate; and if this signal is converted to an electronic signal, a harmonic frequency which is closest to the test signal will mix with that test signal to produce a difference frequency. Most microwave mixers inherently filter the output so that energy resulting from various other mixing products is not transmitted to the output. In the illustrative embodiment, the test frequency is ten gigahertz plus $\Delta f$, and the laser repetition rate of one gigahertz is converted to an electronic signal, the tenth harmonic of which mixes with the ten gigahertz plus $\Delta f$ test signal to generate the difference frequency $\Delta f$ used as the phase reference.

These and other objects, features and benefits of the invention will be better understood from a consideration of the following detailed description taken in conjunction with the accompanying drawing.

DETAILED DESCRIPTION

Figures 1, 2:
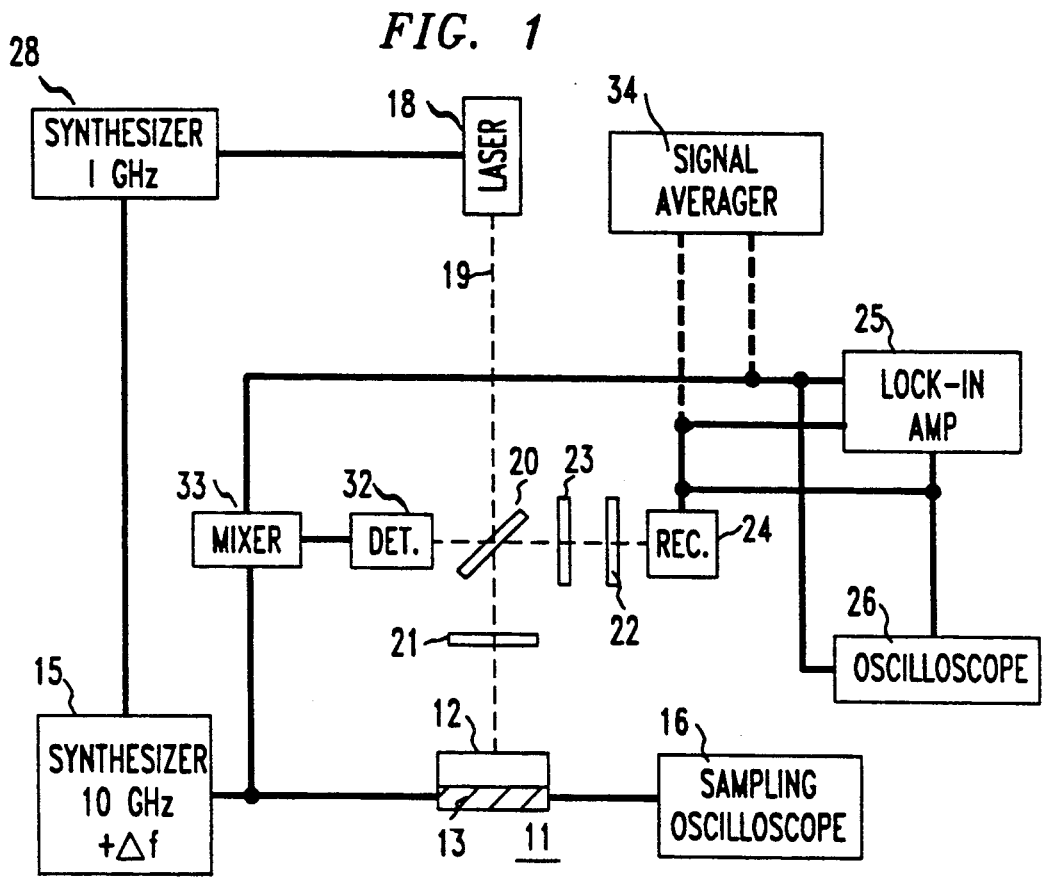
FIG. 1 is a block diagram of apparatus for testing an integrated circuit chip in accordance with one embodiment of the invention.
FIG. 2 is a graph showing light intensity pulses of the laser of FIG. 1.

Referring to FIG. 1, there is shown a functional block diagram of a circuit for testing high-speed or high frequency integrated circuits by using electro-optic sampling for a non-invasive characterization of a test signal in an integrated circuit device 11. The integrated circuit device 11 illustratively comprises a body 12 of crystalline III-V semiconductor material such as gallium arsenide and a conductor 13 for transmitting the test signal. The test signal is generated illustratively by a microwave synthesizer 15, which may produce a test signal having a frequency of ten gigahertz plus $\Delta f$ which is transmitted by the conductor 13 to a sampling oscilloscope 16. The particular test frequency used will be discussed further below.

The propagating test signal is sampled by electro-optic probing which uses a laser 18 to produce a laser beam 19 which is directed through a beam splitter 20 and a quarter wave plate 21 toward the integrated circuit device 11. The body portion 12, being of gallium arsenide, is an electro-optic material; that is, its optical characteristics are changed by electrical fields which extend through it. Thus, the electric field accompanying the test signal propagating on conductor 13 modulates the optical characteristics of semiconductor body 12. The laser light is reflected back upon itself by conductor 13, and, as it propagates through semiconductor body 12 in both directions, it is modulated as a function of the test signal. The reflected light travels through quarter wave plate 20, beam splitter 12, quarter wave plate 23 and an analyzer 22 to a receiver 24. The receiver 24 converts the light wave modulations to electrical modulations that are directed to a lock-in amplifier 25 connected to an oscilloscope 26. As is known in the art, the signal presented by oscilloscope 26 and the lock-in amplifier 25 may constitute a useful characterization of the device under test from which a worker may determine whether the integrated circuit device 11 is operating properly.

In accordance with the known Pockel's effect, electric fields extending into gallium arsenide are capable of modulating the polarization of a laser beam propagating through it. Thus, quarter wave plate 21 is used to circularly polarize the laser beam prior to its transmission through the semiconductor body 12. Analyzer 22 is used to convert the polarization modulations to light intensity modulations so that they can readily be converted by receiver 24 to electrical intensity modulations. As is understood in the art, if the semiconductor body 12 is not made of an electro-optic material, a test probe containing an electro-optic material may be placed in proximity to conductor 13 for modulating a laser beam in accordance with electro-optic probing principles.

The laser 18, which we have used successfully, is a gain-switched semiconductor injection laser. The laser is excited by a source 28, which may illustratively be a one gigahertz microwave synthesizer. Both microwave synthesizers 15 and 28 operate from a single ten megahertz time base for frequency stabilization.

The one gigahertz excitation of laser 18 (along with a d-c bias, not shown) drives the laser to emit light as a train of short pulses. A graph of laser beam intensity versus time is shown in FIG. 2, which depicts pulses 30 having a pulse widths which are relatively short compared to the separation of the pulses. The pulse repetition rate is controlled by the frequency of the synthesizer 28 and is equal to its frequency; that is, the repetition rate of pulses 30 is equal to one gigahertz, or $10^9$ pulses per second.

The phase and frequency of the pulses 30, of course, affects the data displayed by oscilloscope 26. One can also appreciate that if the phase of pulses 30 varied arbitrarily, it would be difficult to interpret the output data so as to characterize the electrical test signal. The common time base aids in providing a predetermined phase output from synthesizers 28 and 15; nevertheless, it has been found that relative phase drifts are common and, in the absence of any other provision, would often lead to inaccurate results.

In accordance with the invention, a phase reference signal is provided by removing a portion of the laser beam 19 by way of partially reflecting mirror 20, converting it to an electrical signal in a detector 32, and mixing that signal in a microwave mixer 33 with a portion of the test signal from synthesizer 15. Elementary Fourier analysis will show that a pulse train as depicted in FIG. 2 contains a high content of higher harmonic frequencies. In the mixer 33, the harmonic frequency closet to that of the test signal from synthesizer 15 mixes with the test signal to produce a difference frequency. That is, the tenth harmonic of the one gigahertz fundamental frequency directed by detector 32 to mixer 33 mixes with the test signal frequency to yield a difference frequency equal to $\Delta f$. This $\Delta f$ difference signal is directed to lock-in amplifier 25, where it is used as a reference phase for interpreting the phase of the signal from the receiver 24. Any phase drift by either synthesizer 15 or 28 will be manifested by a phase change of the reference signal, and can thereby be used to avoid misleading interpretations of the displayed signal. A signal averager 34 may be connected to the receiver 24 and be triggered by the output of the mixer 33 to provide an indication of the electro-optic modulation. The signal averager 34 may be used in lieu of or in addition to the lock-in amplifier and oscilloscope. Although the way in which the phase reference can be used for interpreting data is within the skill of the worker in the art, an appendix attached hereto shows specifically how the phase of the signal displayed can be interpreted using a determination of the phase of the reference signal.

The outputs of most microwave mixers which could be used as mixer 33 are inherently of limited bandwidth. Thus, there is no concern, for example, that the ninth harmonic of the input pulse train may mix with the test signal to give a difference frequency of one gigahertz plus $\Delta f$; the output port of the mixer typically simply would not pass such a high frequency. Another advantage of this self-limiting phenomenon is that one can change the frequency of the test signal and still retrieve a useful reference phase signal. For example, if the output frequency of synthesizer 15 is changed to be nine gigahertz plus $\Delta f$, then the ninth harmonic of the pulse train will mix with it to again give the output frequency $\Delta f$ which may be used as a phase reference. Thus, there may be frequency sweeping as part of the test procedure without necessarily sacrificing phase reference date. For example, with prior art circuits, it is not possible to change the frequency of the test signal and then return to the original test frequency without affecting the phase synchronization between the synthesizers. With the invention, the only precaution one need take is to assure that one of the harmonics is sufficiently close to the test signal frequency as to yield a difference frequency $\Delta f$ that is within the output bandwidth of mixer 33. We therefore may state as a generality that if the laser pulse repetition rate has a fundamental frequency $f_0$, the test signal should have a frequency $Nf_0 + \Delta f$, where N is an integer greater than one, and $\Delta f$ is within the output bandwidth of the mixer.

Generating a laser output in the form of the pulse train shown in FIG. 2 assures a sufficient power at higher harmonic frequencies. As is known, the higher harmonic content of a pulse train is inversely proportional to the duration or width of each pulse divided the separation between successive pulse. By making the pulse durations less than one hundred picoseconds, with a cycle duration of one nanosecond, for example, one assures a high harmonic content.

In experiments that we conducted using the circuit of FIG. 1, the devices 11 were gallium arsenide monolithic microwave integrated circuits operating in the seven to eleven gigahertz range. The microwave synthesizers 15 and 28 were both Model 8341-B synthesizers, available from the Hewlett-Packard Company of Palo Alto, Calif. The laser was a semiconductor injection laser emitting light at 1.3 microns, which was collimated and focused by lenses (not shown) to a spot approximately eight microns in diameter on the device being probed. Gain switching was used in which a sinusoidal modulation of the laser bias current stimulates a relaxation oscillation in the laser which produces a short optical pulse. The pulse repetition frequency was equal to the modulation frequency (one gigahertz) and the pulse duration was typically fifteen to twenty picoseconds, which corresponds to an electro-optic measurement bandwidth in excess of twenty gigahertz. The various wave plates, polarizers, and lenses were optimized with an antireflection coating for 1.3 microns wavelength. The typical optical power received at receiver 24 and detector 32 was about 17 microwatts. The lock-in amplifier 25 that was used is the model 5301A, available from EG&G, Princeton Applied Research of Princeton, N.J. The microwave mixer was a Model DMS1-26A, available from the RHG Electronics Laboratory Co. of New York, N.Y.

It is to be understood that various embodiments and modifications other than those specifically shown can be made by those skilled in the art without departing from the spirit and scope of the invention. For example, any material that is capable of modulating light energy as a function of an applied electric signal may be used as the electro-optic material, and any such material should be considered as being an electro-optic material within the meaning used herein. Any of various kinds of lasers may be used, including the pulse-compressed mode-locked Nd:YAG laser.

APPENDIX

The phase drift immunity provided by relative phase referencing may be understood in more detail by considering how the mixing process gives rise to the phase of the electro-optic signal at the difference frequency. The voltage on the circuit modulating the optical beam is $$V \propto \sin(2\pi(Nf_0 + \Delta f)t + \phi_C). \quad (1)$$

Referring to FIG. 1, the phase of the electrical test signal $\phi_C$ is the phase of the synthesizer 15 driving the device 11, $\phi_{synth(C)}$, plus the phase delay to the device input, $\phi_{el(C)}$, plus the phase delay from the input to the point measured on the circuit, $\phi_{ckt(C)}$.

The signal at the receiver 24, since it is the product of the signal on the circuit and the laser intensity, is composed of a series of frequencies which are the sums and differences of the frequencies of the two mixing signals. The mixing product we are interested in is the one at $\Delta f$ which originates from the optical frequency component $$I(Nf_0) \propto \sin(2\pi Nf_0 t + \phi_L). \quad (2)$$

The phase of the laser signal, $\phi_L$, is the phase of the synthesizer 28 driving the laser 18, $\phi_{synth(L)}$, plus the electrical delay to the laser, $\phi_{el(L)}$, and the optical delay due to the path length between the laser and the mixing point on the device 11, $\phi_{op(L)}$.

Multiplying Eq. 1 with Eq. 2 and using a trigonometric identity, the signal at the difference frequency is $$\Delta I(\Delta f) \propto \cos(2\pi \Delta ft + \phi_{EO}). \quad (3)$$

Breaking the phase of the electro-optic signal, $\phi_{EO} = \phi_C - \phi_L$, into its individual components, $$\phi_{EO} = (\phi_{synth(C)} + \phi_{el(C)} + \phi_{ckt(C)}) - (\phi_{synth(L)} + \phi_{el(L)} + \phi_{op(L)}). \quad (4)$$

The electro-optic phase contains the component $\phi_{synth(C)} - \phi_{synth(L)}$, the phase difference between the synthesizers. This component causes errors since it is subject to change over the course of the measurement.

To eliminate the problems caused by synthesizer phase changes, we create a reference that also has the phase component, $\phi_{synth(C)} - \phi_{synth(L)}$, so when the signal is compared with the reference, the phase shifts due to the synthesizers cancel out. We use a high speed photodiode as detector 22 to obtain an electrical signal from the laser pulses, which is then mixed with the signal driving the device 11 to obtain a reference signal at the difference frequency. The phase of the reference, $\phi_R$, is the phase difference between the electrical signal at the mixer and the optical signal at the mixer.

$$\phi_R = (\phi_{synth(C)} + \phi_{el(CR)}) - (\phi_{synth(L)} + \phi_{el(L)} + \phi_{op(R)} + \phi_{el(LR)}). \quad (5)$$

Thus, the phase of the reference contains the difference in phase between the synthesizers, plus a series of constant terms $\phi_{el(CR)}$, $\phi_{el(L)}$, $\phi_{op(R)}$, and $\phi_{el(LR)}$, representing respectively the fixed delays of the electrical signal from the signal synthesizer to the mixer, the electrical signal from the laser synthesizer to the laser, the optical signal from the laser to the photodiode, and the electrical signal from the photodiode to the mixer.

Comparing $\phi_{EO}$ with $\phi_R$, the difference between the phases of the synthesizers 15 and 28 cancels and the measurement becomes independent of changes in synthesizer phase. The remaining terms determining the phase are fixed delays that are constant over the course of the measurement.

We claim:

1. A method for testing an electronic device comprising the steps of:
    locating an electro-optic material in proximity to a conductor of the device;
    causing a first electrical signal having a first frequency to be transmitted by the conductor such that the signal modulates optical characteristics of the electro-optic material;
    generating a beam of laser light pulses having a second repetition rate;
    the first frequency being at least twice the second repetition rate;
    directing a first part of the laser beam through at least part of the electro-optic material such that the material modulates the laser light in accordance with the first electronic signal;
    generating a second electrical pulsed signal having a pulse rate equal to the second repetition rate;
    generating a third electrical signal having a frequency equal to the difference of the first frequency and a harmonic of a frequency equal to the second repetition rate;

the step of generating the third electrical signal comprising the step of mixing part of the first electrical signal with at least part of the second electrical signal;

and using the third electrical signal as an aid in characterizing the electronic device.

2. The method of claim 1 wherein:

the step of generating the second electrical pulsed signal comprises the step of directing a second part of the laser beam to a photodetector.

3. The method of claim 1 wherein:

the step of using the third signal comprises the step of using the phase of the third signal as an aid in interpreting changes of the phase of the first signal during operation of the electronic device being tested.

4. The method of claim 1 wherein:

the separation time of successive light pulses is much longer than the durations of the pulses, whereby the laser light beam and the second electrical signal contain a high content of higher harmonic frequencies.

5. The method of claim 1 wherein:

the first frequency is a microwave frequency and the mixing step comprises the step of mixing the first and second signals in a microwave mixer.

6. The method of claim 1 wherein:

the third signal has a frequency $\Delta f$, the second signal has a second pulse repetition rate $f_0$, and the first signal has a first frequency $Nf_0+\Delta f$, where N is an integer greater than one.

7. The method of claim 1 further comprising the step of:

detecting the first part of the laser beam after modulation and using it to analyze the first electrical signal.

8. The method of claim 1 further comprising the step of:

using the modulated first part of the laser beam to generate a fourth electrical signal;

and analyzing the fourth electrical signal to determine characteristics of the first electrical signal.

9. Apparatus for testing an electronic device comprising a conductor, the apparatus comprising:

an electro-optic material in proximity to the conductor of the device;

means for causing a first electrical signal having a first frequency to propagate along the conductor such that the electric fields thereof extend into the electro-optic material;

means for generating a beam of laser pulses having a second repetition rate;

the first frequency being at least twice the second repetition rate;

means for directing a first part of the laser beam through at least part of the electro-optic material such that the material modulates the laser light in accordance with the first electronic signal;

means for directing a second part of the laser beam to a photodetector which converts the laser pulses to a second electrical signal;

means for generating a third electrical signal having a frequency equal to the difference of the first frequency and a harmonic of a frequency equal to the second repetition rate;

the generating means comprising a mixer for mixing part of the first electrical signal with at least part of the second electrical signal;

and means for detecting the third electrical signal, whereby it may be used as an aid in characterizing the electronic device.

10. The apparatus of claim 9 wherein:

the laser light pulses contain a relatively high content of higher harmonic frequency.

11. The apparatus of claim 9 wherein:

the first frequency is a microwave frequency and the mixer is a microwave mixer.

12. The apparatus of claim 9 wherein:

the third signal has a frequency $\Delta f$, the second signal has a second pulse repetition rate $f_0$, and the first signal has a first frequency $Nf_0+\Delta f$, where N is an integer.

13. The apparatus of claim 9 further comprising:

means for detecting the first part of the laser beam after modulation and for displaying it, whereby it may be used to analyze the first electrical signal.

14. The apparatus of claim 9 further comprising:

means for converting the modulated first part of the laser beam to a fourth electrical signal;

and means for displaying the fourth electrical signal, thereby to permit a determination of characteristics of the fist electrical signal.

* * * * *